United States Patent [19]
Karasawa et al.

[11] 4,215,934
[45] Aug. 5, 1980

[54] PRINTING APPARATUS

[75] Inventors: Tamotsu Karasawa, Kawasaki; Ichiro Kano; Hideki Yoshinari, both of Yokohama, all of Japan

[73] Assignee: Canon Kabushiki Kaisha, Tokyo, Japan

[21] Appl. No.: 949,048

[22] Filed: Oct. 6, 1978

[30] Foreign Application Priority Data

Oct. 6, 1977 [JP] Japan .................... 52-120420

[51] Int. Cl.² .............. G03B 27/48; G03B 27/50; G03B 27/70
[52] U.S. Cl. .................... 355/51; 350/55; 350/199; 355/45; 355/60
[58] Field of Search ............ 355/45, 51, 60; 350/55, 350/199, 294

[56] References Cited

U.S. PATENT DOCUMENTS

| | | | |
|---|---|---|---|
| 3,748,015 | 7/1973 | Offner | 350/55 |
| 4,011,011 | 3/1977 | Hemstreet et al. | 355/45 X |

Primary Examiner—Richard A. Wintercorn
Attorney, Agent, or Firm—Fitzpatrick, Cella, Harper & Scinto

[57] ABSTRACT

A printing apparatus for use in the manufacture of semiconductor circuit elements, comprising a fixed mirror imaging system. A mask holder and wafer holder are respectively provided in an upper horizontal plane and a lower horizontal plane on the optical axis above and below said mirror imaging system, the light emerging from the mask being introduced into said system by a mirror inclined at 45° to the optical axis while the light emerging from said system is directed to the wafer by an another mirror inclined at 45° to the optical axis. The mask holder and wafer holder are integrally movable in the horizontal direction to allow formation of the entire image of mask on the wafer.

5 Claims, 2 Drawing Figures

PRINTING APPARATUS

BACKGROUND OF THE INVENTION

1. Field of the Invention

The present invention relates to a printing apparatus for use in the manufacture of semiconductor integrated circuit elements, such as IC, LSI or ultra-LSI, and more particularly to a printing apparatus for forming an image of a mask on a wafer to print a mask pattern thereon through an optical mirror imaging system.

2. Description of the Prior Art

An optical mirror imaging system is already known for example as disclosed in U.S. Pat. No. 3,748,015 and in the U.S. patent application Ser. No. 701,946. Also a printing apparatus utilizing an optical mirror imaging system is already known as disclosed in the German OLS No. 2410924. In said known apparatus, however, the mask and wafer are subjected to scanning by rotary motion about a point at the printing. For this reason there may result an unevenness in the exposure as the speed varies from a position close to the center of rotation to a position apart therefrom.

SUMMARY OF THE INVENTION

The object of the present invention is to provide a printing apparatus avoiding the above-mentioned drawback.

More specifically the present invention relates to an improvement in the printing apparatus utilizing an optical mirror imaging system, said improvement residing in that a mask and a wafer can be respectively placed in an upper plane and a lower plane in the printing apparatus, in that a common optical axis of a spherical mirror of the optical mirror imaging system is arranged parallel to said planes, and further in that the mask and wafer are rendering relatively displaceable in the direction of said optical axis. The above-mentioned structure makes possible a printing apparatus of an improved working efficiency and capable of projecting a real-size image of an elevated resolution of the mask into the wafer.

DESCRIPTION OF THE PREFERRED EMBODIMENT

Figure 1:
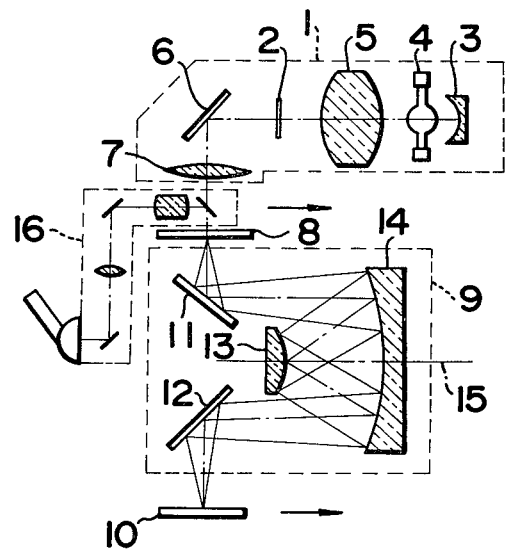
FIG. 1 is a view showing an optical arrangement of the apparatus embodying the present invention.

Referring to FIG. 1 showing the optical arrangement of the apparatus embodying the present invention, there is shown an optical source system 1 for illuminating a mask, comprising, along a horizontal axix 2, spherical mirror 3, a mercury lamp 4, a lens 5, a 45° angled mirror 6 and a lens 7. Said system is further provided with a filter (not shown) for eliminating the limit actinic to the wafer, said filter being inserted into the optical path of said illuminating system at the alignment of the mask and wafer.

There are also shown a mask 8 positioned in an upper horizontal plane and supported by a known mask holder (not shown) and an optical mirror imaging system 9 for forming the image of mask 8 onto a wafer 10, in a lower horezantal plane, said system being composed of two 45° angled mirrors 11, 12, a convex mirror 13 and a concave mirror 14, said convex and concave mirrors 13, 14 having a common optical axis 15 parallel to said upper and lower horizontal planes. The details of such optical mirror imaging system are disclosed in the above-mentioned U.S. Pat. No. 3,748,015 and U.S. patent application Ser. No. 701,946 and will not, therefore, be repeated in the present specification.

The wafer 10 is supported by a known wafer holder which is finely adjustable in the directions of x, y and $\theta$ in the usual manner.

A microscope optical system 16 is insertable into the optical path between the lens 7 and mask 8 at the alignment operation in order to examine if the mask 8 and wafer 10 are brought to a determined mutual relationship. Said relationship, if not reached, is achievable by displacing the wafer with respect to the mask by means of the above-mentioned means for adjustment in the directions of x, y and $\theta$.

Figure 2:
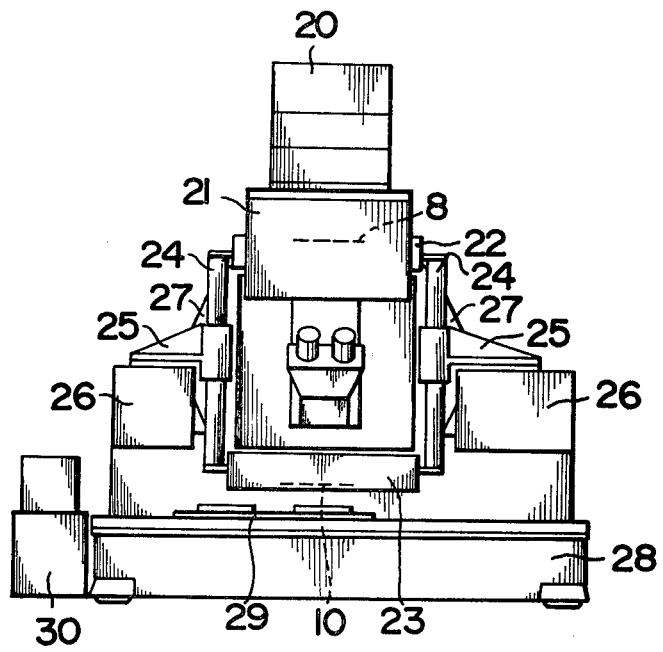
FIG. 2 is an external elevational view of the apparatus of the present invention.

Now referring to FIG. 2 showing the external view of the apparatus embodying the present invention, there are shown a lamp housing 20 accommodating the illuminating system shown in FIG. 1; a unit 21 accommodating the microscope for alignment, which is displaceable forward or backward along the optical axis 15 shown in FIG. 1; a mask holder 22 and a wafer holder 23 which are rendered integrally displaceable by means of a link member 24, said wafer holder 23 still allowing fine adjustments of the wafer with respect thereto; an arm 25 fixed to said link member 24 and supported by a guide means 26 whereby said mask and wafer holders 22, 23 are rendered horizontally and linearly displaceable by a horizontal displacement mechanism therefor incorporated in said guide means 26; a casing 27 for accommodating the optical mirror imaging system; a support 28, a turntable 29 and an automatic feeder 30 by which the wafers are automatically supplied to the wafer holder through the turntable 29.

Now there will given an explanation on the function of the above-explained apparatus shown in FIGS. 1 and 2.

At first the position of wafer 10 is aligned to that of mask 8. During this aligning operation the aforementioned filter is inserted into the optical source system 1 whereby a sector-shaped image of the light source is formed on the mask through the lenses 5, 7 by means of light not actinic to the wafer. Also the microscope optical system 16 is inserted between the lens 7 and mask 8 for observing the alignment marks on the mask 8 and wafer 10, and the alignment is achieved by displacing the wafer holder. Upon completion of the alignment, said filter and microscope are retracted from the optical path. At the same time the light source 4 is extinguished or the light therefrom is intercepted by an unrepresented shutter means. Upon successive relighting of the light source 4 or reopening of the shutter means, there is formed a sector-shaped image of the light source on the mask by the actinic light. Simultaneously the guide 25 initiates a horizontal displacement on the guide 26 whereby an entire image of the mask is printed onto the wafer.

In the present invention the horizontal displacement of the mask and wafer holders 22, 23 makes it possible easily to achieve an accruate linearity in the displacement, thus eliminating the uneven exposure. Also the illuminating system 1 positioned in the upper portion of the apparatus makes it possible to eliminate the effect to heat on other components.

What we claim is:

1. A printing apparatus for use in the manufacture of semiconductor circuit elements, comprising:
   an illuminating system;
   a mask holder for supporting said mask in an upper plane;
   a wafer holder for supporting a wafer in a lower plane;
   a fixed optical mirror imaging system comprising a concave mirror and a convex mirror the centers of curvature of which lie substantially on an optical axis positioned between said upper and lower planes and are parallel thereto;
   linear guide means; and
   a displacing mechanism incorporated in said guide means for displacing said mask holder and wafer holder linearly in the direction of said optical axis.

2. A printing apparatus according to the claim 1 wherein said mask holder and wafer holder are rendered integrally displaceable by means of a link member.

3. A printing apparatus according to the claim 1 wherein said light source is adapted to illuminate said mask from above.

4. A printing apparatus according to claim 3, wherein a microscope optical system is inserted into the optical path between said illuminating system and said mask.

5. A printing apparatus for use in the manufacture of semiconductor circuit elements, comprising:
   an illuminating system for illuminating a mask;
   a mask holder for supporting said mask in an upper plane;
   a wafer holder for supporting a wafer in a lower plane;
   optical mirror imaging means comprising a concave mirror and a convex mirror the centers of curvature of which lie substantially on an optical axis positioned between said upper and lower planes and are parallel thereto; and
   displacing means for displacing one of said means linearly in the direction of said optical axis relatively to the other of said means.

* * * * *